United States Patent
Huang et al.

(10) Patent No.: US 10,183,856 B2
(45) Date of Patent: Jan. 22, 2019

(54) MANUFACTURING METHOD OF MICRO-ELECTRO-MECHANICAL SYSTEMS DEVICE

(71) Applicant: SensorTek technology Corp., Hsinchu County (TW)

(72) Inventors: Hsin-Hung Huang, Hsinchu County (TW); Wei-Yang Ou, Hsinchu County (TW)

(73) Assignee: SensorTek technology Corp., Hsinchu County (TW)

( * ) Notice: Subject to any disclaimer, the term of this patent is extended or adjusted under 35 U.S.C. 154(b) by 0 days.

(21) Appl. No.: 15/871,083

(22) Filed: Jan. 15, 2018

(65) Prior Publication Data

US 2018/0201496 A1    Jul. 19, 2018

Related U.S. Application Data

(60) Provisional application No. 62/446,811, filed on Jan. 16, 2017.

(51) Int. Cl.
*B81B 3/00*     (2006.01)
*C23C 16/02*    (2006.01)
*B81C 1/00*     (2006.01)

(52) U.S. Cl.
CPC ........ *B81B 3/0005* (2013.01); *B81C 1/00984* (2013.01); *C23C 16/0245* (2013.01); *B81C 2201/112* (2013.01)

(58) Field of Classification Search
CPC .......... B81B 3/0005; B81C 1/00984; B81C 2201/112; C23C 16/0245
See application file for complete search history.

(56) References Cited

U.S. PATENT DOCUMENTS

| | | | |
|---|---|---|---|
| 6,906,845 B2 | 6/2005 | Cho | |
| 7,045,170 B1 | 5/2006 | Hankins | |
| 2004/0137750 A1* | 7/2004 | Nemoto | C23C 16/0245 438/719 |
| 2005/0045276 A1* | 3/2005 | Patel | B81C 1/00476 156/345.43 |
| 2006/0246631 A1 | 11/2006 | Lutz | |
| 2012/0184067 A1* | 7/2012 | Shi | B81B 3/0005 438/106 |

FOREIGN PATENT DOCUMENTS

| | | |
|---|---|---|
| CN | 1314086 C | 5/2007 |
| TW | 201532682 A | 9/2015 |
| TW | 201545886 A | 12/2015 |
| TW | 201636355 A | 10/2016 |

* cited by examiner

*Primary Examiner* — Allan R Wilson
(74) *Attorney, Agent, or Firm* — Winston Hsu

(57) ABSTRACT

A manufacturing method for a Micro-Electro-Mechanical Systems (MEMS) structure includes implementing a surface modification process, to form a transformation layer on the surfaces of the MEMS structure; implementing an anti-stiction coating pre-clean process, to clean the transformation layer on the surfaces towards a particular direction; and implementing an anti-stiction coating process, to coat a monolayer on the surfaces of the MEMS structure.

11 Claims, 6 Drawing Sheets

MANUFACTURING METHOD OF MICRO-ELECTRO-MECHANICAL SYSTEMS DEVICE

CROSS REFERENCE TO RELATED APPLICATIONS

This application claims the benefit of U.S. Provisional Application No. 62/446,811, filed on Jan. 16, 2017 and entitled "Pre-ASC clean process to improve stiction failure and hermeticity failure simultaneously", the contents of which are incorporated herein in their entirety.

BACKGROUND OF THE INVENTION

1. Field of the Invention

The present invention relates to a manufacturing method of micro-electro-mechanical systems device, and more particularly, to a manufacturing method capable of improving the stiction failure and the hermeticity failure of the micro-electro-mechanical systems device simultaneously.

2. Description of the Prior Art

With the advances of the technology, the industry keeps downsizing the consumer electronics while improving the quality and the functionality of the consumer electronics simultaneously. To meet the design concepts of the products, sensing devices (e.g. the sensor for sensing pressure, sound wave or acceleration) of the consumer electronics are usually realized by Micro-Electro-Mechanical Systems (MEMS) devices. The failure scenarios which frequently occur in MEMS devices include the stiction failure and the hermeticity failure.

In general, to prevent the stiction failure in the MEMS device, the prior art coats a monolayer on the MEMS structure of the MEMS device to prevent stiction between MEMS structures; for example, China Patent No.1314086C, U.S. Pat. No. 6,906,845, No. 7,045,170 and No. 20060246631 respectively provide a manufacturing method of coating the monolayer to improve the MEMS structure and prevent the stiction failure. Correspondingly, to prevent the hermeticity failure occurred in the MEMS device, the prior art implements a clean process to the bonding rings of the MEMS device and the cap wafer before bonding the MEMS device and the cap wafer. Therefore, the following bonding process benefits from the clean process, such that the water vapour and the dust are kept away from entering the MEMS device to further maintain the reliability of the MEMS device. However, the processes for preventing the stiction failure and the hermeticity failure in the prior art affect interactively, such that the stiction failure and the hermeticity failure may not be improved simultaneously.

For example, please refer to FIG. 1, which illustrates a process of a conventional manufacturing method of a MEMS device. As shown in FIG. 1, the MEMS structure of the MEMS device may be composed of a structure wafer and a cap wafer. Before implementing a eutectic bonding process to bond the cap wafer and the structure wafer, the clean process may be implemented to the cap wafer and the structure wafer to clean the bonding rings of the cap wafer and the structure wafer to avoid the hermeticity failure of the MEMS device. However, the clean process damages the monolayer which is coated during an anti-stiction coating process, such that the stiction failure may occur to the manufactured MEMS device.

Please refer to FIG. 2, which illustrates a process of a conventional manufacturing method of a MEMS device. Compared to the manufacturing method shown in FIG. 1, if the clean process is implemented before the surface modification process, the monolayer may be protected without damaged by the clean process, such that the stiction failure of the MEMS device may be avoided. However, before implementing the anti-stiction coating process to coat the monolayer on the structure wafer, the surface modification process is implemented to the structure wafer to modify the surface materials of the MEMS structure, such that the monolayer is easier to be coated on the surfaces of the MEMS structure. Under such a circumstance, the surface modification process degrades the bonding ring, such that the hermeticity failure is more likely to occur after the structure wafer and the cap wafer are bonded.

According to the above description, the processes for preventing the stiction failure and the hermeticity failure in the prior art affect interactively, such that at least one of the stiction failure and the hermeticity failure is more likely to occur in the MEMS structure. Therefore, how to improve the stiction failure and the hermeticity failure of the MEMS structure has become a primary objective in the field.

SUMMARY OF THE INVENTION

To solve the problems above, the present invention provides a manufacturing method capable of improving the stiction failure and the hermeticity failure of the MEMS structure simultaneously.

In an aspect, the present invention discloses a manufacturing method for a Micro-Electro-Mechanical Systems (MEMS) structure, comprising implementing a surface modification process to a structure wafer, to form a transformation layer on the surfaces of the MEMS structure; implementing an anti-stiction coating pre-clean process to the structure wafer, to clean the transformation layer on the surfaces towards a particular direction; and implementing an anti-stiction coating process to the structure wafer, to coat a monolayer layer on the surfaces of the MEMS structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
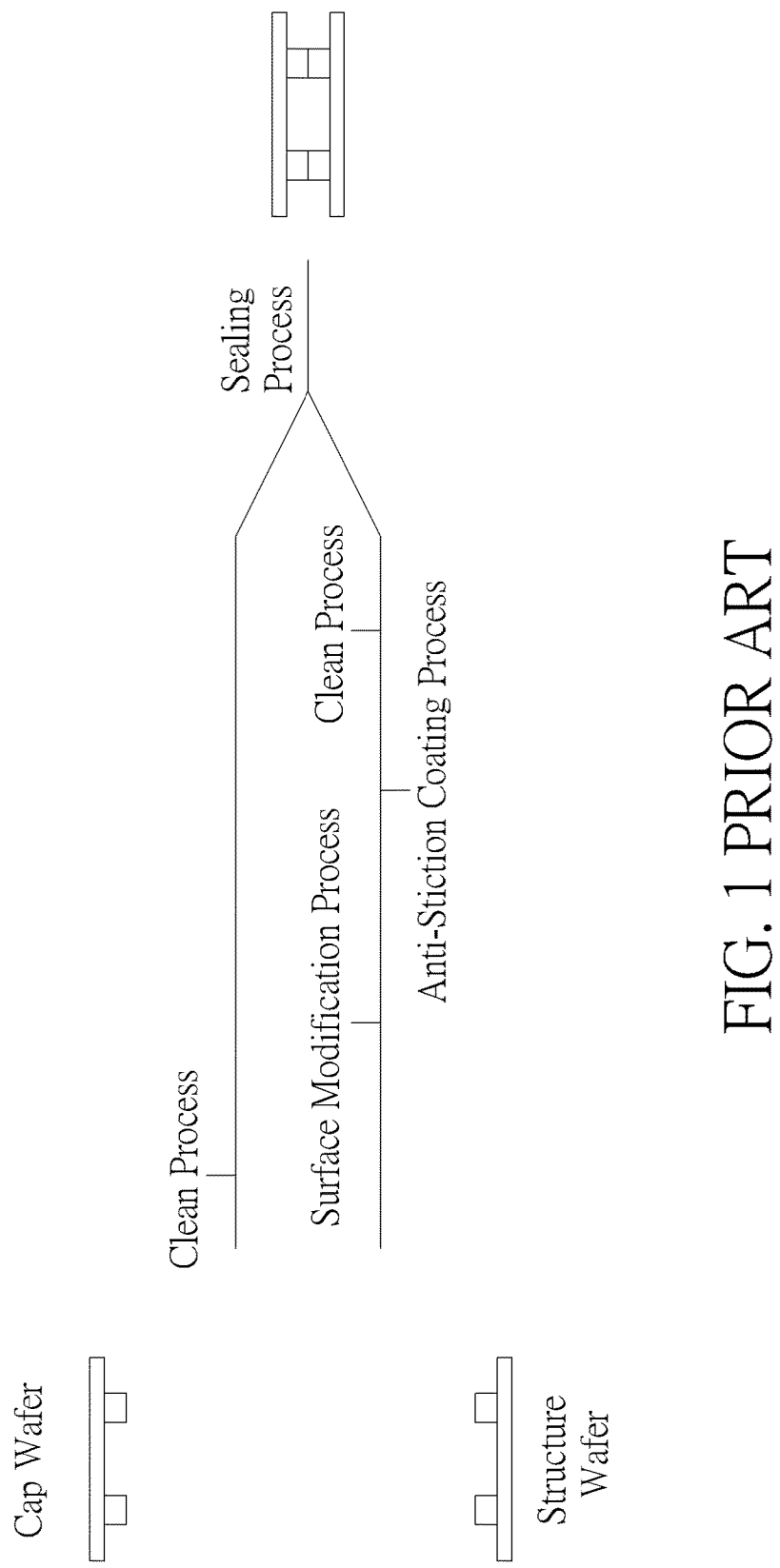
FIG. 1 illustrates a process of a conventional manufacturing method of a MEMS device.
Figure 2:
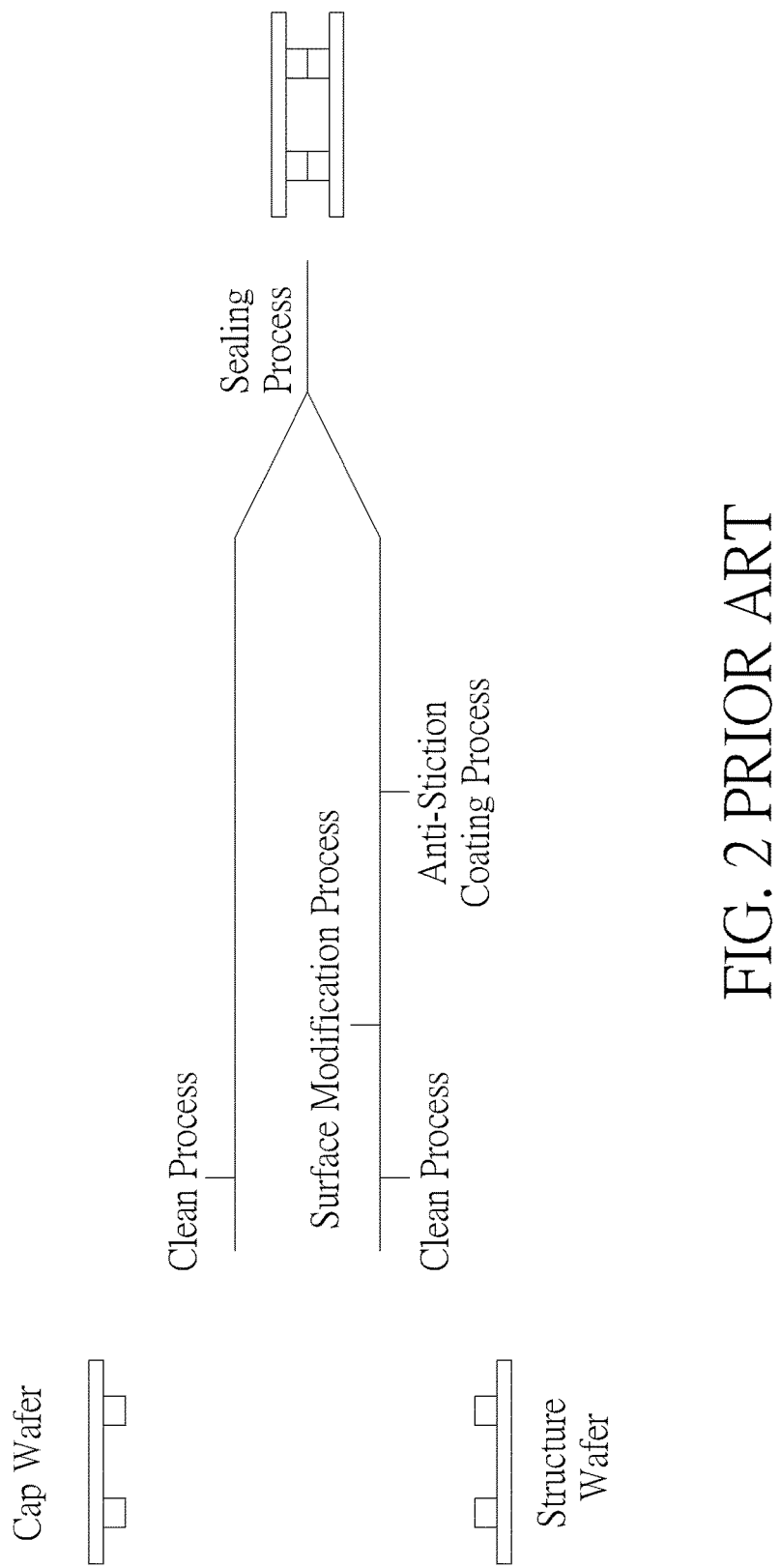
FIG. 2 illustrates a process of a conventional manufacturing method of a MEMS device.
Figure 3:
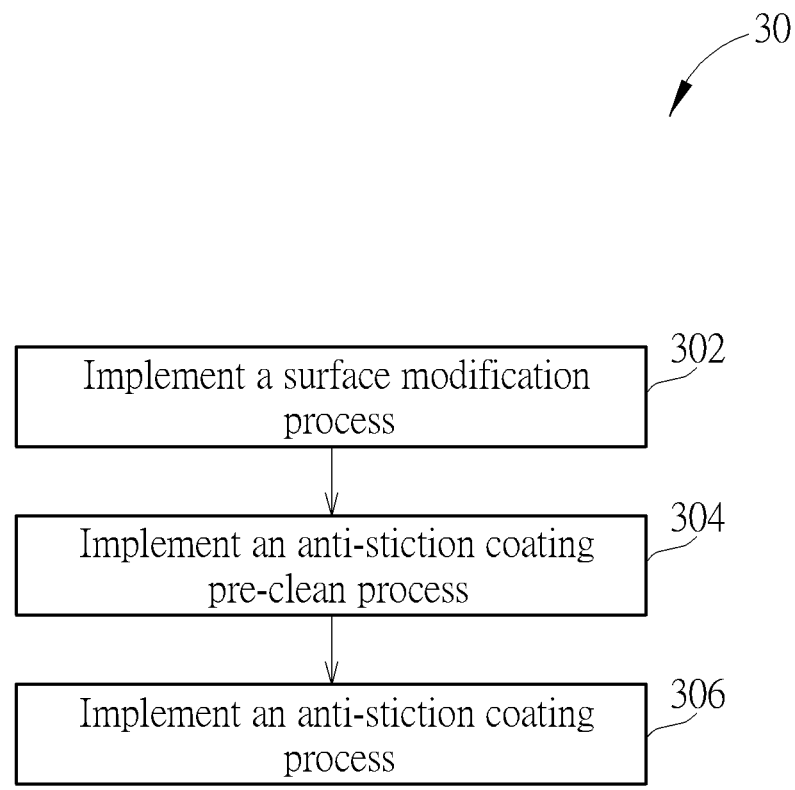
FIG. 3 illustrates a process of a manufacturing method according to an embodiment of the present invention.

Please refer to FIG. 3, which illustrates a process of a manufacturing method 30 according to an embodiment of the present invention. The manufacturing method 30 may be applied for manufacturing Micro-Electro-Mechanical Systems (MEMS) devices in the electronic products. For example, the MEMS device may be utilized to sense pressure, acoustic wave or acceleration, etc., and is not limited herein. As shown in FIG. 3, the manufacturing method 30 comprises:

Step 302: Implement a surface modification process.

Step 304: Implement an anti-stiction coating pre-clean process.

Step 306: Implement an anti-stiction coating process.

Figure 4:
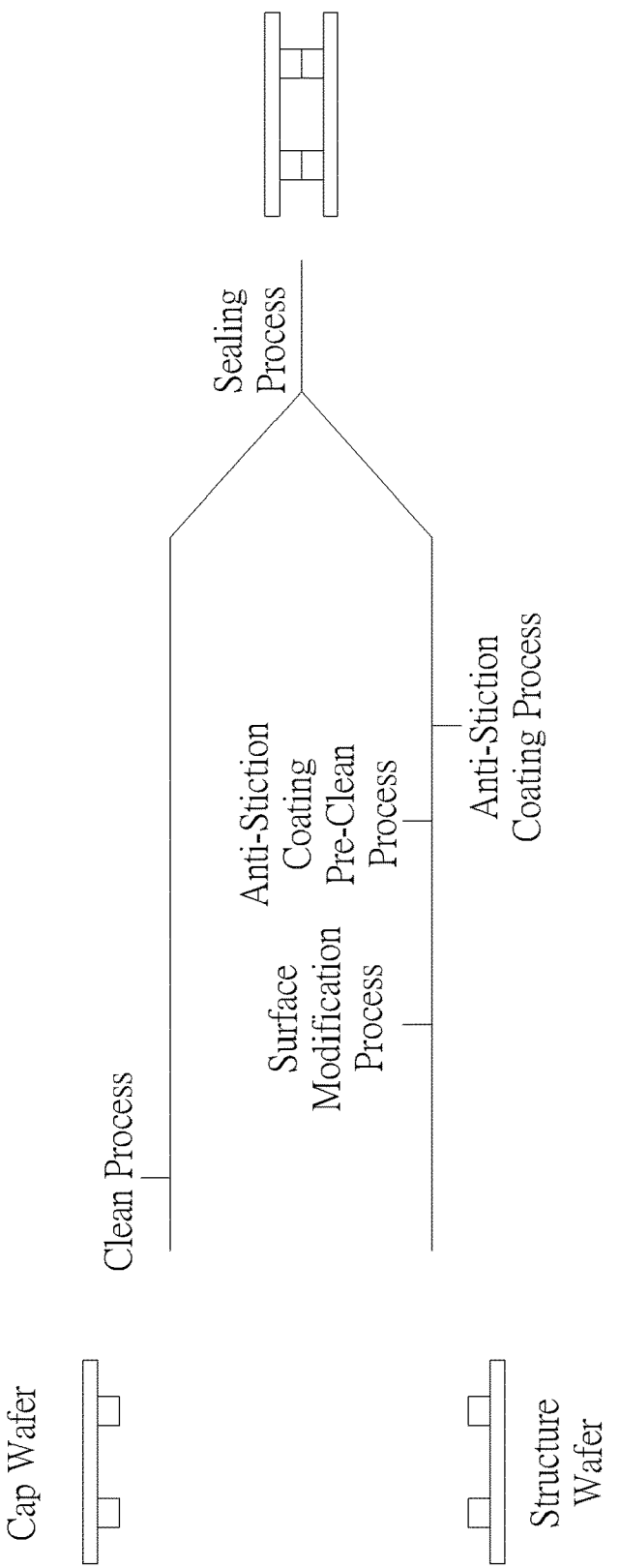
FIG. 4 illustrates a process of a manufacturing method of a MEMS device according to an embodiment of the present invention.

About the detailed description of the manufacturing method 30, please refer to FIG. 4 and the following statements. First, in order to coat a monolayer for anti-stiction on a MEMS structure on a structure wafer more easily, the isotropic surface modification process is implemented to change the surface materials of the MEMS structure on the structure wafer. In one embodiment, the surface modification process is an oxygen plasma treatment process without substrate bias, and is not limited herein.

Figure 5:
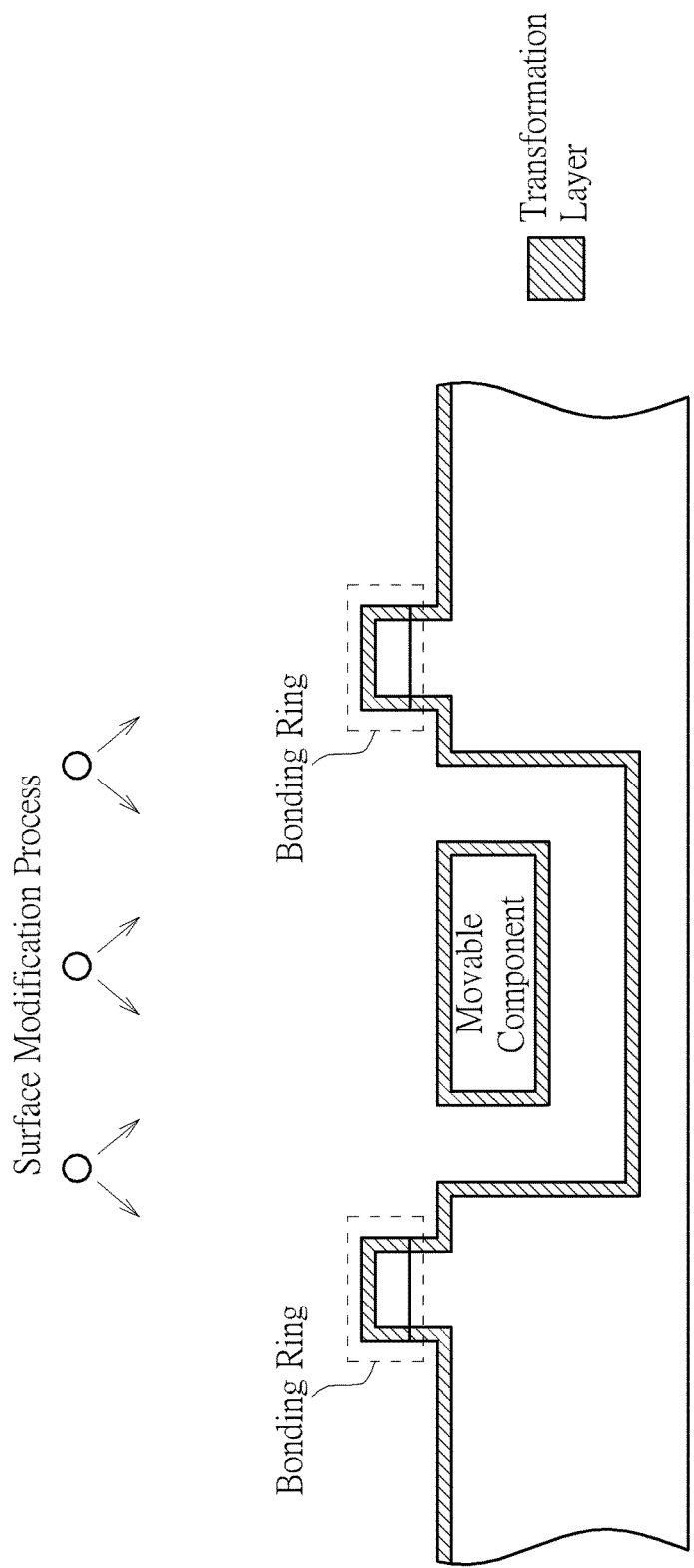
FIG. 5 is a schematic diagram of a MEMS structure according to an embodiment of the present invention.

Because the substrate in the surface modification process is not biased, the process gas used by the surface modification process does not move towards a particular direction, i.e. the process gas is isotropic, such that the surface modification process changes the surface materials of all surfaces of the MEMS structure to form a transformation layer. Taking the oxygen plasma treatment process stated above as an example, because the substrate of the structure wafer is not biased, there are more collisions between the oxygen ions used by the surface modification process, such that the oxygen ions move with worse linearity and shorter mean free path. Therefore, the oxygen ions may effectively modify the surfaces of the MEMS structure in different directions (including the surfaces on the side and the surfaces being shaded). Please refer to FIG. 5, which is a schematic diagram of a MEMS structure manufactured by an embodiment of the present invention, wherein the MEMS structure on the structure wafer comprises a movable component and a bonding ring for bonding a cap wafer. As shown in FIG. 5, after implementing the surface modification process, the surfaces of the MEMS structure in different directions (including the surfaces on the side, the surfaces being shaded by the movable component and the bonding ring) are able to be modified to the transformation layer (e.g. an oxide layer).

Then, the anti-stiction coating pre-clean process, which is anisotropic, is implemented to further clean the transformation layer on the surfaces of the MEMS structure towards a particular direction (e.g. facing up). For example, the anti-stiction coating pre-clean process may be the plasma-cleaning process of inert gas (e.g. argon) with substrate bias.

Figure 6:
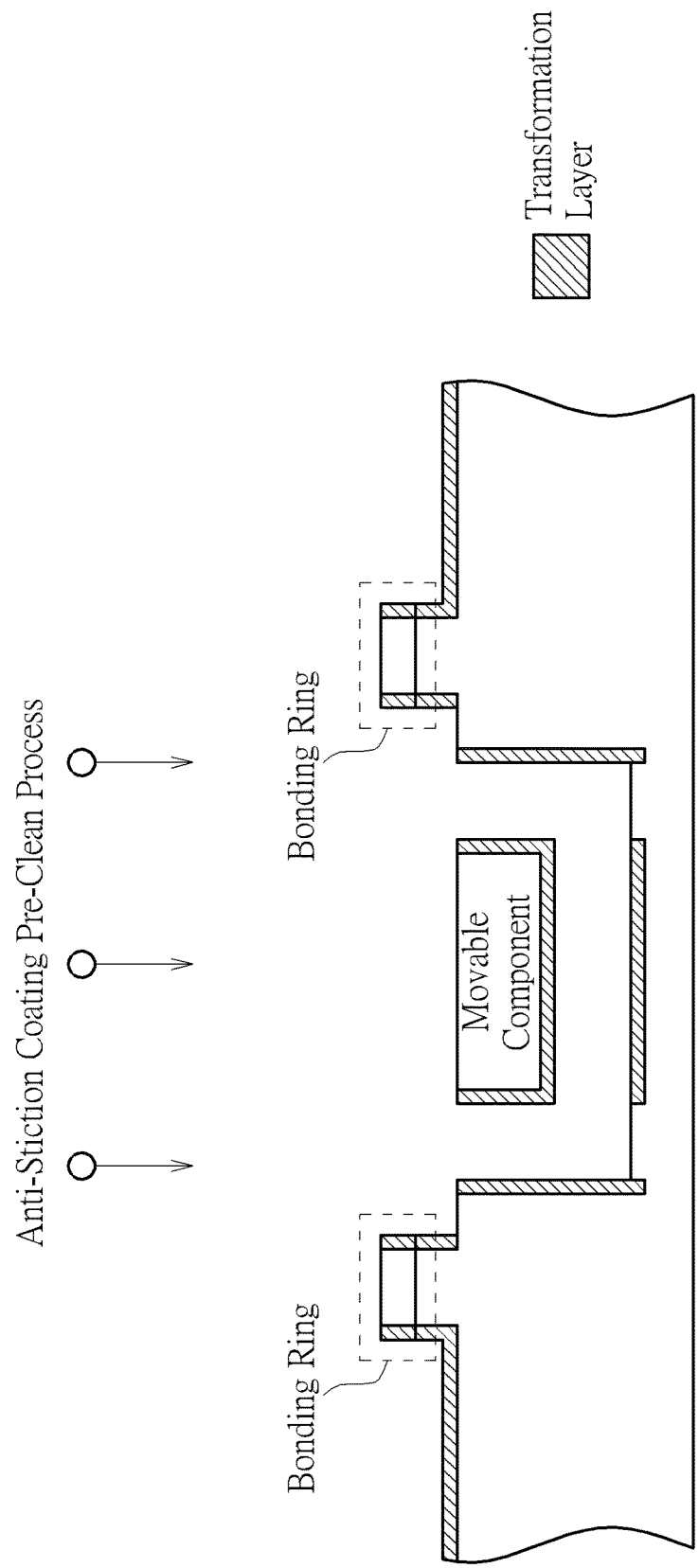
FIG. 6 is a schematic diagram of a MEMS structure according to an embodiment of the present invention.

It is noted that because the substrate is biased, the process gas used by the anti-stiction coating pre-clean process move towards a particular direction, i.e. the process gas is anisotropic, such that the anti-stiction coating pre-clean process cleans the transformation layer on the surfaces towards the particular direction. Taking the plasma-cleaning process of inert gas stated above as an example, through applying the substrate bias (e.g. a negative voltage) under the MEMS structure, there are fewer collisions between the argon ions used by the anti-stiction coating pre-clean process, such that the argon ions move with better linearity and longer mean free path. Therefore, the argon ions may effectively clean the surfaces of the MEMS structure towards the particular direction, such that the surfaces of the MEMS structure towards other directions are not affected. Please refer to FIG. 6, which is a schematic diagram of a MEMS structure according to an embodiment of the present invention. According to the embodiment shown in FIG. 6, through applying the substrate bias under the MEMS structure, the process gas moves downward, such that the anti-stiction coating pre-clean process cleans the transformation layer of the surfaces of the MEMS structure which faces upward. Under such a circumstance, since the transformation layer of the surfaces of the bonding ring of the MEMS structure which faces upward is cleaned, the bonding ring may be properly bonded to the cap wafer. In addition, the transformation layer on the surfaces which face other directions (i.e. the surfaces on the side) or the surfaces which are shaded by other objects (i.e. the surfaces shaded by the movable component) is not substantially affected. Therefore, when the anti-stiction coating process is implemented to the MEMS structure, the monolayer may be properly coated on the surfaces of the MEMS structure, such that the stiction failure is avoided on the MEMS structure.

Please refer to FIG. 4 again to implement an anti-stiction coating process on the structure wafer to form the monolayer on the surfaces of the MEMS structure. The anti-stiction coating process may be a chemical vapor deposition (CVD) process using dichlorodimethylsilane (DDMS), octadecyltrichlorosilane (OTS), 1H, 1H, 2H, 2H-perfluorodecyltrichlorosilane (FDTS) or 1H, 1H, 2H, 2H-perfluorooctyltrichlorosilane (FOTS). The CVD process may be an atmospheric pressure CVD (APCVD) process, a low-pressure CVD (LPCVD) process, a plasma-enhanced CVD (PECVD) process, and is not limited herein.

After forming the monolayer on the surfaces of the MEMS structure, a sealing (Hermeticity seal) process (e.g. the eutectic bonding process using the material of Al/Ge) is implemented to bond the cap wafer with the structure wafer, so as to manufacture the MEMS device. Moreover, a cap wafer clean process may be preferably implemented on the cap wafer before the sealing process is implemented, wherein the cap wafer clean process may as well be the plasma-cleaning process of inert gas with substrate bias. Accordingly, the bonding ring on the cap wafer may be cleaned before implementing the sealing process, which is beneficial to the implementation of the following sealing process to further elevate the hermeticity level of the MEMS device.

Through adopting the manufacturing method 30 shown in FIG. 3, the monolayer on the surfaces of the MEMS structure is not damaged by the following process, such that the stiction failure is avoided on the MEMS device. In addition, the bonding ring on the MEMS structure for bonding the cap wafer may be bonded to the cap wafer tightly, such that the hermeticity failure of the MEMS device is more unlikely to occur. In other words, the manufacturing method 30 of the present invention may improve the stiction failure and the hermeticity failure issues of the MEMS device. According to different applications and design concepts, the manufacturing method 30 may be adaptively modified or adjusted. For example, before implementing the surface modification process, a clean process may be implemented to the structure wafer to improve the hermeticity failure of the MEMS device.

Furthermore, according to another embodiment of the present invention, a structure clean process may be implemented before the surface modification process, wherein the structure clean process may as well be a plasma-cleaning process of inert gas with substrate bias. Accordingly, the surfaces and the bonding ring of the MEMS structure on the structure wafer may be cleaned before implementing the surface modification process, which is beneficial to the implementation of the following sealing process to further elevate the hermeticity level of the MEMS device.

In summary, the manufacturing method disclosed in the above embodiments implement an additional anti-stiction coating pre-clean process between implementing the surface modification process and the anti-stiction coating process to the MEMS structure, such that the bonding ring is not affected by the surface modification process and bonds tightly in the following bonding process. In addition, after implementing the anti-stiction coating pre-clean process, the anti-stiction coating process may properly coat the monolayer on the surfaces of the MEMS structure. Therefore, the manufacturing method disclosed in the above embodiments may improve the stiction failure and the hermeticity failure issues of the MEMS device simultaneously.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a Micro-Electro-Mechanical Systems (MEMS) structure, comprising:
   implementing a surface modification process to a structure wafer, to form a transformation layer on the surfaces of the MEMS structure;
   implementing an anti-stiction coating pre-clean process to the structure wafer, to clean the transformation layer on the surfaces towards a particular direction; and
   implementing an anti-stiction coating process to the structure wafer, to coat a monolayer layer on the surfaces of the MEMS structure.

2. The manufacturing method of claim 1, wherein the structure wafer comprises a bonding ring of the MEMS structure, and the anti-stiction coating pre-clean process cleans the transformation layer of the bonding ring towards the particular direction.

3. The manufacturing method of claim 1, wherein the surface modification process is isotropic.

4. The manufacturing method of claim 3, wherein the surface modification process is an oxygen plasma treatment process without substrate bias.

5. The manufacturing method of claim 1, wherein the transformation layer is an oxide layer.

6. The manufacturing method of claim 1, wherein the anti-stiction coating pre-clean process is anisotropic.

7. The manufacturing method of claim 6, wherein the anti-stiction coating pre-clean process is a plasma-cleaning process of inert gas with substrate bias.

8. The manufacturing method of claim 1, wherein the anti-stiction coating process is a chemical vapor deposition process using one of dichlorodimethylsilane, octadecyltrichlorosilane, 1H, 1H, 2H, 2H-perfluorodecyltrichlorosilane and 1H, 1H, 2H, 2H-perfluorooctyltrichlorosilane.

9. The manufacturing method of claim 1, further comprising:
   before implementing the surface modification process, implementing a structure clean process to the structure wafer.

10. The manufacturing method of claim 1, further comprising:
    after implementing the anti-stiction coating process, implementing a sealing process so as to bond a cap wafer and the structure wafer.

11. The manufacturing method of claim 10, further comprising:
    before implementing the sealing process, implementing a cap wafer clean process to the cap wafer.

* * * * *